(12) United States Patent
Park

(10) Patent No.: US 7,491,990 B2
(45) Date of Patent: Feb. 17, 2009

(54) CMOS IMAGE SENSORS FOR PREVENTING OPTICAL CROSSTALK

(75) Inventor: Byung-jun Park, Gyeonggi-do (KR)

(73) Assignee: Samsung Electronics Co., Ltd. (KR)

(*) Notice: Subject to any disclaimer, the term of this patent is extended or adjusted under 35 U.S.C. 154(b) by 170 days.

(21) Appl. No.: 11/374,225

(22) Filed: Mar. 13, 2006

(65) Prior Publication Data
US 2007/0045665 A1 Mar. 1, 2007

(30) Foreign Application Priority Data
Aug. 29, 2005 (KR) .................. 10-2005-0079274

(51) Int. Cl.
H01L 31/062 (2006.01)
H01L 31/113 (2006.01)
H01L 27/148 (2006.01)
H01L 29/768 (2006.01)

(52) U.S. Cl. .................. 257/292; 257/294; 257/215
(58) Field of Classification Search .................. 257/215, 257/290–294
See application file for complete search history.

(56) References Cited

U.S. PATENT DOCUMENTS

| 6,316,814 | B1 | 11/2001 | Nagata et al. | |
| 6,448,596 | B1 * | 9/2002 | Kawajiri et al. | 257/292 |
| 2002/0117690 | A1 * | 8/2002 | Rhodes | 257/215 |

FOREIGN PATENT DOCUMENTS

| KR | 100165388 B1 | 4/1995 |
| KR | 1020040065769 A | 1/2003 |
| KR | 1020040093940 A | 11/2004 |
| KR | 1020040093981 A | 11/2004 |

OTHER PUBLICATIONS

Notice to Submit Response, Korean Application No. 10-2005-0079274, Oct. 27, 2006.

* cited by examiner

Primary Examiner—Cuong Q Nguyen
(74) Attorney, Agent, or Firm—Myers Bigel Sibley & Sajovec

(57) ABSTRACT

An integrated circuit device includes a CMOS image sensor and a MIM capacitor therein. The CMOS image sensor includes a transfer gate electrode on a semiconductor substrate and a P-N junction photodiode within the semiconductor substrate. The photodiode is located adjacent a first side of the transfer gate electrode. A floating diffusion region is also provided within the semiconductor substrate. This floating diffusion region is located adjacent a second side of the transfer gate electrode. An interlayer insulating layer is provided on the semiconductor substrate. The interlayer insulating layer extends opposite the transfer gate electrode, the P-N junction photodiode and the floating diffusion region. An optical shielding layer of a first material is provided on the interlayer insulating layer. The optical shielding layer has a single opening therein, which extends opposite the P-N junction photodiode. This single opening inhibits optical crosstalk between adjacent unit cells within the sensor. A metal-insulating-metal (MIM) capacitor is also provided on the interlayer insulating layer. The MIM capacitor has an electrode (e.g., lower electrode) formed of the first material.

21 Claims, 8 Drawing Sheets

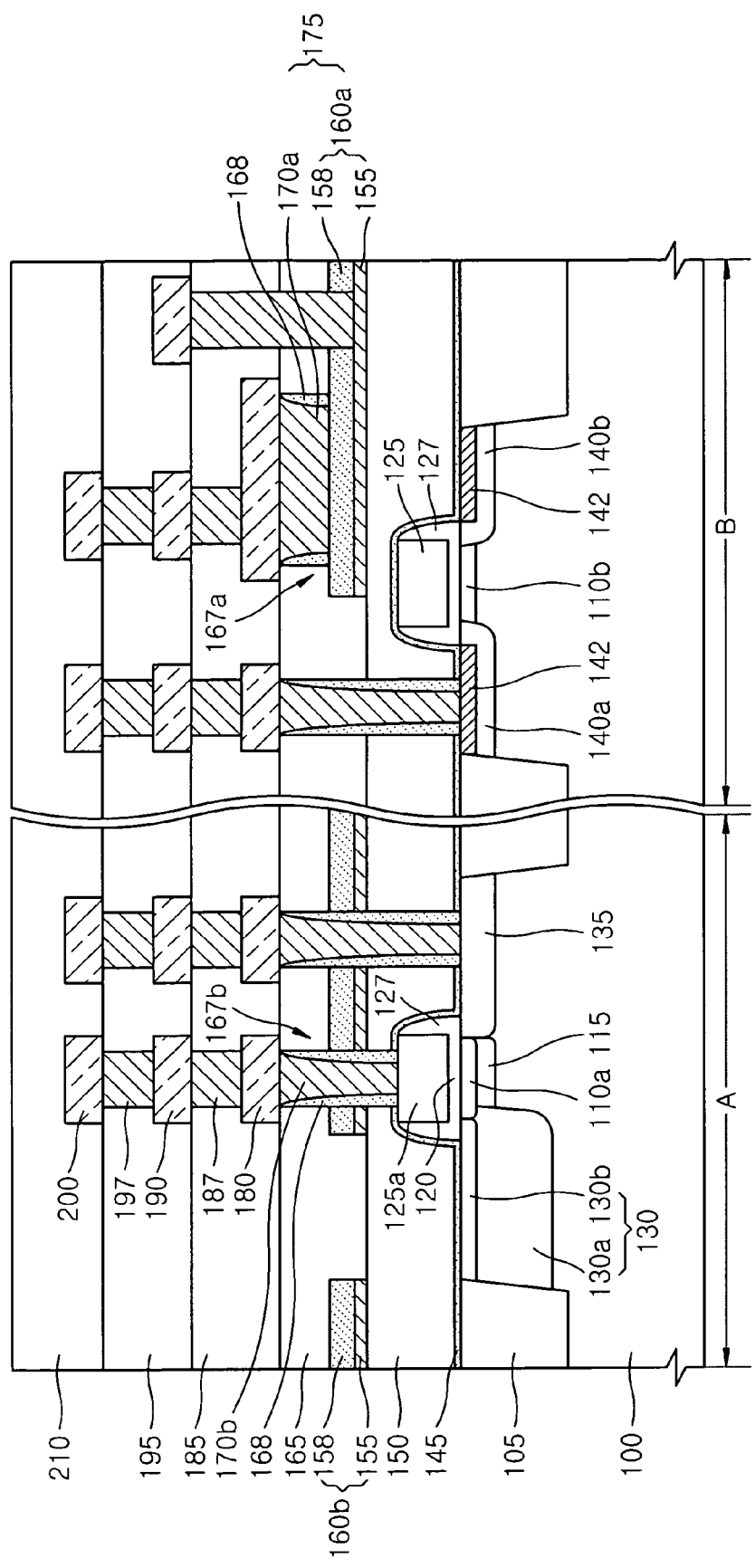

CMOS IMAGE SENSORS FOR PREVENTING OPTICAL CROSSTALK

REFERENCE TO PRIORITY APPLICATION

This application claims the benefit of Korean Patent Application No. 10-2005-0079274, filed on Aug. 29, 2005, in the Korean Intellectual Property Office, the disclosure of which is hereby incorporated herein in its entirety by reference.

FIELD OF THE INVENTION

The present invention relates to integrated circuit devices and methods of manufacturing integrated circuit devices and, more particularly, to CMOS image sensors and methods of manufacturing CMOS image sensors.

BACKGROUND OF THE INVENTION

CMOS image sensors can be manufactured at relatively low manufacturing costs as compared to Charge Couple Devices (CCDs), and thus are frequently used as the preferred type of solid-state image device. Because a unit pixel of a CMOS image sensor is formed with MOS transistors, a CMOS image sensor typically can be embodied within a smaller footprint area than that of a CCD. Furthermore, signal processing logic (e.g., circuits such as Correlated Double Sampling (CDS), Analog Digital Converter (ADC), and a ramp generator), can be formed simultaneously with the MOS transistors that constitute a unit pixel. Accordingly, the CMOS image sensor supports system-on-a-chip manufacturing.

A unit pixel of a CMOS image sensor includes a photodiode for sensing images, and transistors for transferring the signal sensed by the photodiode to a signal processing circuit. Such a unit pixel of the CMOS image sensor is shown in FIG. 1. Referring to FIG. 1, a transfer gate 15 is formed on a semiconductor substrate 10 where an active region is defined by an isolating layer 11. A photodiode 20 is formed in the active region on one side of the transfer gate 15, and a floating diffusion region 25 is formed in the active region on another side of the transfer gate 15. When the transfer gate 15 is formed, a gate of a reset transistor for resetting the floating diffusion region 25, a gate of a source follower transistor, and a gate of a select transistor may be simultaneously formed. The transfer gate 15 and the floating diffusion region 25 are respectively connected to a metal interconnect 30 and an external power source. The metal interconnect 30 includes multiple-layered metal interconnects 30a, 30b, and 30c. The metal interconnects 30a, 30b, and 30c are insulated from one another by respective interlayer insulating layers 35. The metal interconnect 30 are formed of a light blocking material and are disposed to surround a periphery of the photodiode 20. By allowing the metal interconnect 30 to surround the periphery of each photodiode 20, the pixels can be partitioned and somewhat shielded from each other.

However, as the resolution of the CMOS image sensor is increased, optical crosstalk may occur even though the metal interconnect 30 surrounds each photodiode 20 and acts as an optical shield.

More specifically, as shown in FIG. 1, the crosstalk is caused by obliquely incident light 50 that is incoming to an adjacent photodiode 20 through an interval among the metal interconnects 30a, 30b, and 30c disposed on the same plane, or due to mutual reflection among the upper and lower metal interconnects 30a, 30b, and 30c. Furthermore, when viewed from the same plane, the metal interconnects 30a, 30b, and 30c are spaced apart from the photodiode 20 by a predetermined distance. Therefore, the light is scattered and the quantity of the obliquely incident light is increased, so that the degree of crosstalk can be severe. Such crosstalk may mix data to cause color blurring, and brighten surrounding pixels when a bright image is scanned. In FIG. 1, a reference character (e) denotes charge generated by the photodiode 20, in response to receipt of optical information. Accordingly, obliquely incident light cannot be thoroughly blocked by the metal interconnect 30 surrounding the photodiode 20.

SUMMARY OF THE INVENTION

Embodiments of the invention include an integrated circuit device having a CMOS image sensor and a MIM capacitor therein. The CMOS image sensor includes a transfer gate electrode on a semiconductor substrate and a P-N junction photodiode within the semiconductor substrate. The photodiode is located adjacent a first side of the transfer gate electrode. A floating diffusion region is also provided within the semiconductor substrate. This floating diffusion region is located adjacent a second side of the transfer gate electrode. An interlayer insulating layer is provided on the semiconductor substrate. The interlayer insulating layer extends opposite the transfer gate electrode, the P-N junction photodiode and the floating diffusion region. An optical shielding layer of a first material is provided on the interlayer insulating layer. The optical shielding layer has an opening therein, which extends opposite the P-N junction photodiode. A metal-insulating-metal (MIM) capacitor is also provided on the interlayer insulating layer. The MIM capacitor has an electrode (e.g., lower electrode) formed of the first material. In some of these embodiments, the first material is selected from a group consisting of aluminum, tungsten and titanium nitride.

According to preferred aspects of these embodiments, the CMOS image sensor is configured so that the optical shielding layer has only a single optically transparent opening therein. This optically transparent opening extends opposite the P-N junction photodiode. The MIM capacitor also includes a capacitor dielectric layer. This capacitor dielectric layer comprises a second material. The CMOS image sensor also includes a hard mask layer on the optical shielding layer. This hard mask layer is also formed of the second material. This second material may be silicon nitride. These embodiments further include a first electrically conductive contact plug. This plug extends through the optical shielding layer and contacts the floating diffusion region. A second electrically conductive contact plug is also provided. This plug, which extends through the optical shielding layer, contacts the transfer gate electrode.

Still further embodiments of the present invention include methods of forming integrated circuit devices by forming a transfer gate electrode of a CMOS image sensor on a semiconductor substrate and forming a P-N junction photodiode in the semiconductor substrate. This photodiode extends adjacent a first side of the transfer gate electrode. A floating diffusion region is also formed in the semiconductor substrate. This floating diffusion region extends adjacent a second side of the transfer gate electrode. Additional steps include forming an interlayer insulating layer on the semiconductor substrate. This interlayer insulating layer is formed to cover the transfer gate electrode, the P-N junction photodiode and the floating diffusion region. A first metal layer is formed on the interlayer insulating layer and a dielectric layer is formed on the first metal layer. The dielectric layer and the first metal layer are patterned to define an optical shielding layer, which has an opening therein extending opposite the P-N junction photodiode, and also define a capacitor dielectric region and a lower capacitor electrode of a MIM capacitor.

According to another embodiment of the present invention, there is provided a CMOS image sensor including a semiconductor substrate having a pixel region and a peripheral circuit region. Transistors constituted by gate electrodes and junction regions are respectively formed on proper places of the pixel region and the peripheral circuit region. A photodiode is formed in the semiconductor substrate at one side of the transistor on the pixel region. An interlayer insulating layer is formed on the semiconductor substrate where the transistors and the photodiode are formed. Also, a lower electrode of an MIM (Metal-Insulator-Metal) capacitor is formed on an upper surface of the interlayer insulating layer corresponding to the peripheral circuit region. An optical shielding layer is entirely formed on an upper surface of the interlayer insulating layer of the pixel region to expose the photodiode only.

According to still another embodiment of the present invention, there is provided a CMOS image sensor including a semiconductor substrate having a pixel region and a peripheral circuit region. Transistors are respectively formed on proper places of the pixel region and the peripheral circuit region, and a photodiode is formed in the semiconductor substrate at one side of the transistor on the pixel region. A first interlayer insulating layer is formed on the semiconductor substrate where the transistors and the photodiode are formed. A lower electrode is formed on an upper surface of the first interlayer insulating layer of the peripheral circuit region, and includes a capacitor insulating layer on a surface thereof. An optical shielding layer is formed on an entire surface of the first interlayer insulating layer of the pixel region, and exposes the photodiode. A second interlayer insulating layer is formed on the first interlayer insulating layer including the lower electrode and the optical shielding layer, and an upper electrode is formed on the second interlayer insulating layer disposed on the capacitor insulating layer. Also, a metal interconnect structure is formed on the second interlayer insulating layer, and electrically connected to the gate electrode, a selected junction region, and the upper electrode of the transistor.

BRIEF DESCRIPTION OF THE DRAWINGS

FIGS. 2A through 2E are sectional views illustrating a method of manufacturing a CMOS image sensor according to one embodiment of the present invention;

DETAILED DESCRIPTION OF THE INVENTION

Figure 1:
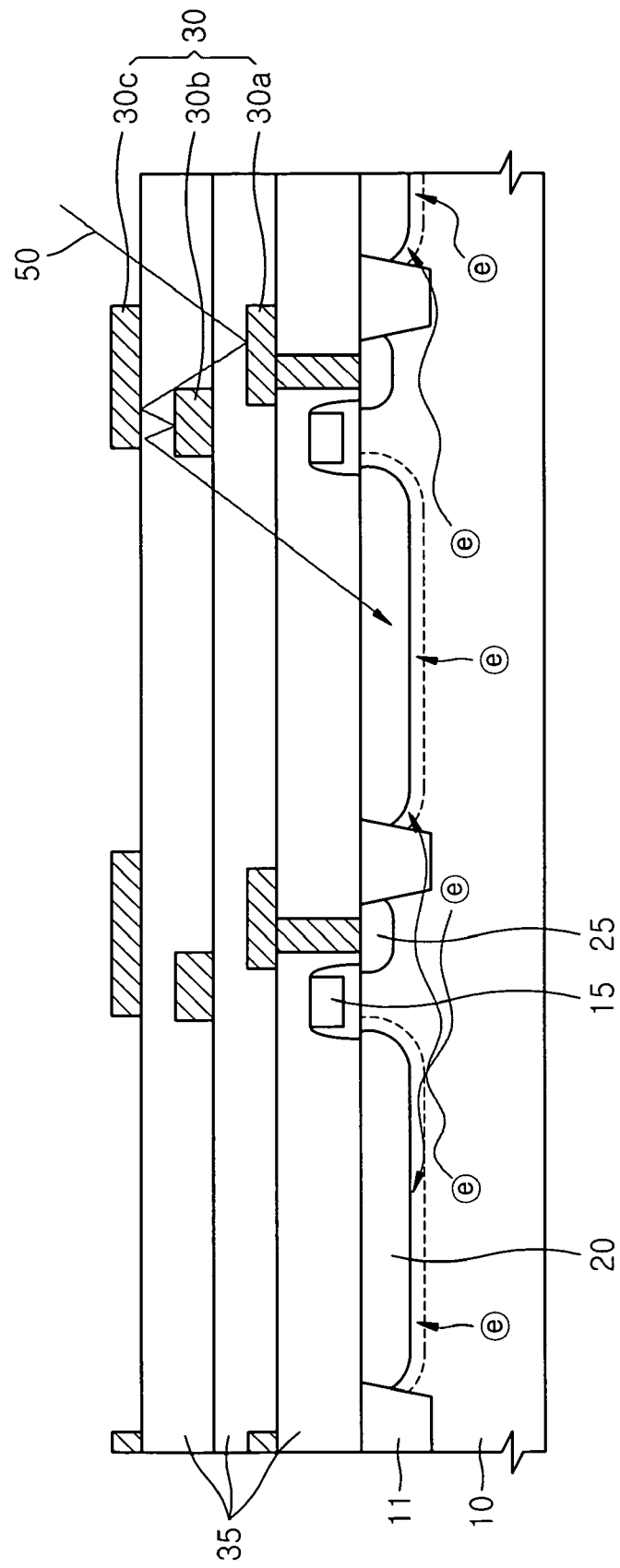
FIG. 1 is a sectional view illustrating generation of crosstalk in a conventional CMOS image sensor.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the shapes of elements are exaggerated for clarity. Like reference numerals in the drawings denote like elements.

Embodiments of the present invention can inhibit crosstalk between adjacent pixels by forming an optical shielding layer that shields a pixel region (except for a photodiode) simultaneously with forming a lower electrode of a metal-insulator-metal (MIM) capacitor of a peripheral circuit. Since the optical shielding layer is formed simultaneously with forming the lower electrode of the MIM capacitor, a separate processing step is not required. A specific example of such a CMOS image sensor will now be described.

Figure 2A:
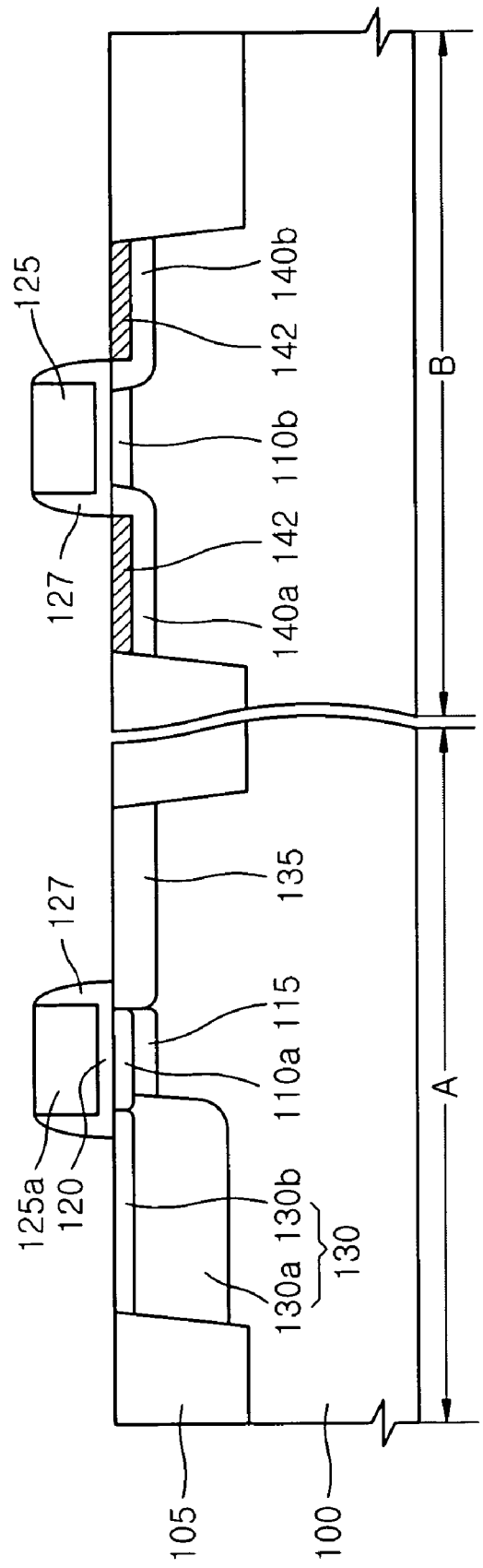

FIGS. 2A through 2E are sectional views illustrating manufacturing processing according to one embodiment of the present invention. In FIGS. 2A through 2E, a region designated by reference character A denotes a pixel region, and a region designated by reference character B denotes a peripheral circuit region. Referring to FIG. 2A, an isolating layer 105 is formed in a predetermined portion of a semiconductor substrate 100 having a first conductivity type (e.g., a p-type silicon substrate), to thereby define an active region. In this case, the semiconductor substrate 100 may be doped at an appropriate level to form a device, however, an impurity well (not shown) may also be formed if necessary. The isolating layer 105 may be a Shallow Trench Isolation (STI) layer, and a channel stop region (not shown) may be formed on a sidewall and a bottom surface of the isolating layer 105 using conventional techniques. The channel stop region may be formed as an impurity region of equal type relative to the semiconductor substrate 100, and may act to remove a dark source of charge.

Thereafter, a pre-channel region is selectively defined, and first impurity regions 110a and 110b are formed. The first impurity regions 110a and 110b may have an impurity type (e.g., p-type), identical to that of the semiconductor substrate 100 and are used for removing the dark source in the pixel region A and adjusting a threshold voltage in the peripheral circuit region B. Also, a second impurity region 115 may be selectively formed underneath the first impurity region 110a of the pixel region A. The second impurity region 115 may have a conductivity type opposite to that of the first impurity region 110a. The second impurity region 115 is provided to prevent a blooming phenomenon caused by an overflow of captured optical electrons toward a neighboring pixel, when a large quantity of optical electrons is captured.

Then, a gate electrode 125 including a gate oxide layer 120 is formed on an upper portion of the semiconductor substrate 100. Gate spacers 127 are formed along sidewalls of the gate electrodes 125 and 125a using conventional techniques. An n-type impurity is implanted into the active region on one side of the transfer gate electrode 125a to form an n-photodiode region 130a, and a p-type impurity is implanted to a surface of the n-photodiode region 130a to form a p-photodiode region 130b, thereby forming the photodiode 130. Here, impurity implantation to form the n-photodiode region 130a and the p-photodiode region 130b may be performed by tilt ion implantation, for example.

Subsequently, an impurity (e.g., an n-type impurity), is implanted into the active region on the other side of the transfer gate electrode 125a and both sides of the other gate electrode 125, so that a floating diffusion region 135 is formed and junction regions 140a and 140b are formed. A metal silicide layer 142 is selectively formed in the junction regions 140a and 140b of the peripheral circuit region B.

Figure 2B:
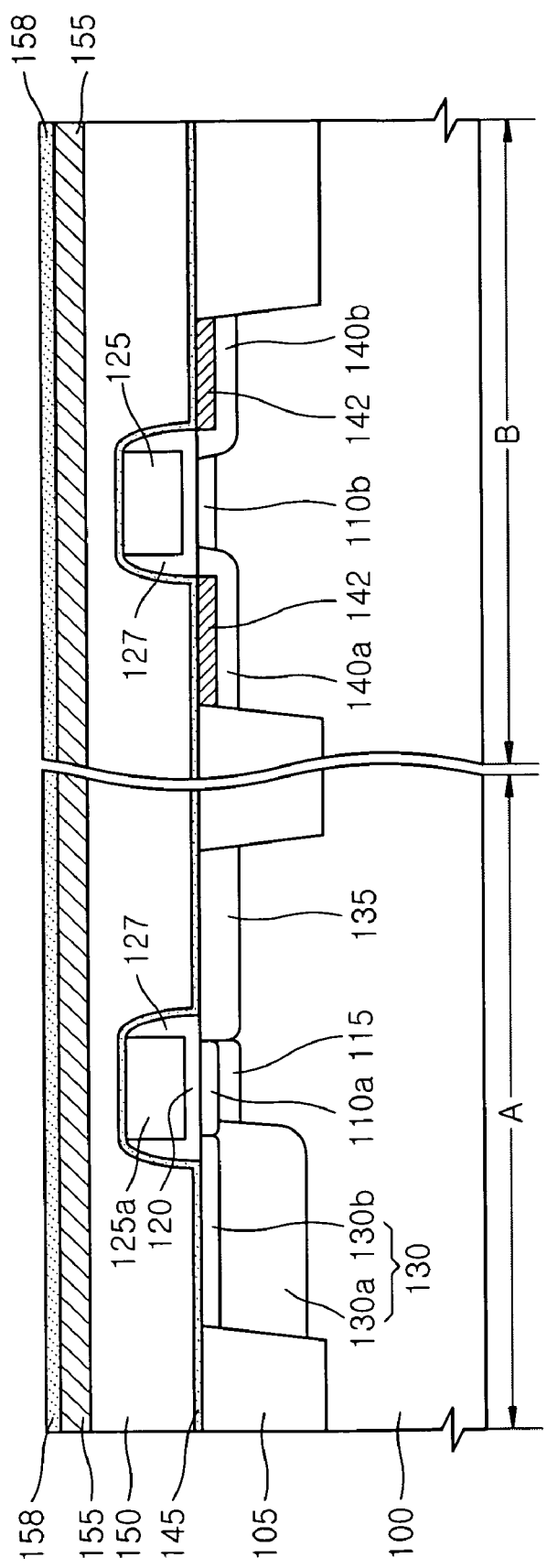

Referring to FIG. 2B, an etch stopper layer 145 and a first interlayer insulating layer 150 are sequentially formed on the entire surface of the resultant structure of the semiconductor substrate 100. As is well known in the art, the etch stopper 145 may be formed of silicon nitride to a thickness of, e.g., 100~500□. The first interlayer insulating layer 150 may be formed of an insulating layer including silicon oxide. Thereafter, in order to form an MIM capacitor on the peripheral circuit region B, a first metal layer 155, for a lower electrode, and a capacitor insulating layer 158 are sequentially deposited on the entire surface of the first interlayer insulating layer 150. In this case, the capacitor insulating layer 158 may be formed of silicon nitride, with an excellent dielectric constant, and used as a hard mask layer for patterning the first metal layer 155.

Figure 2C:
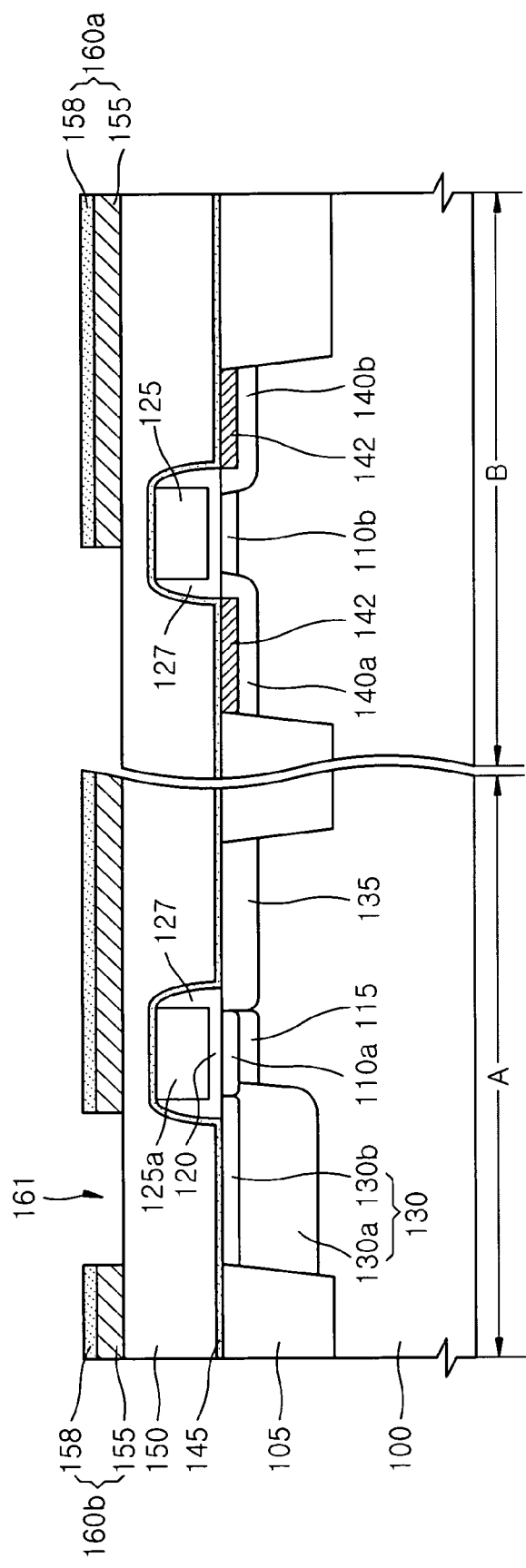
Figure 3:
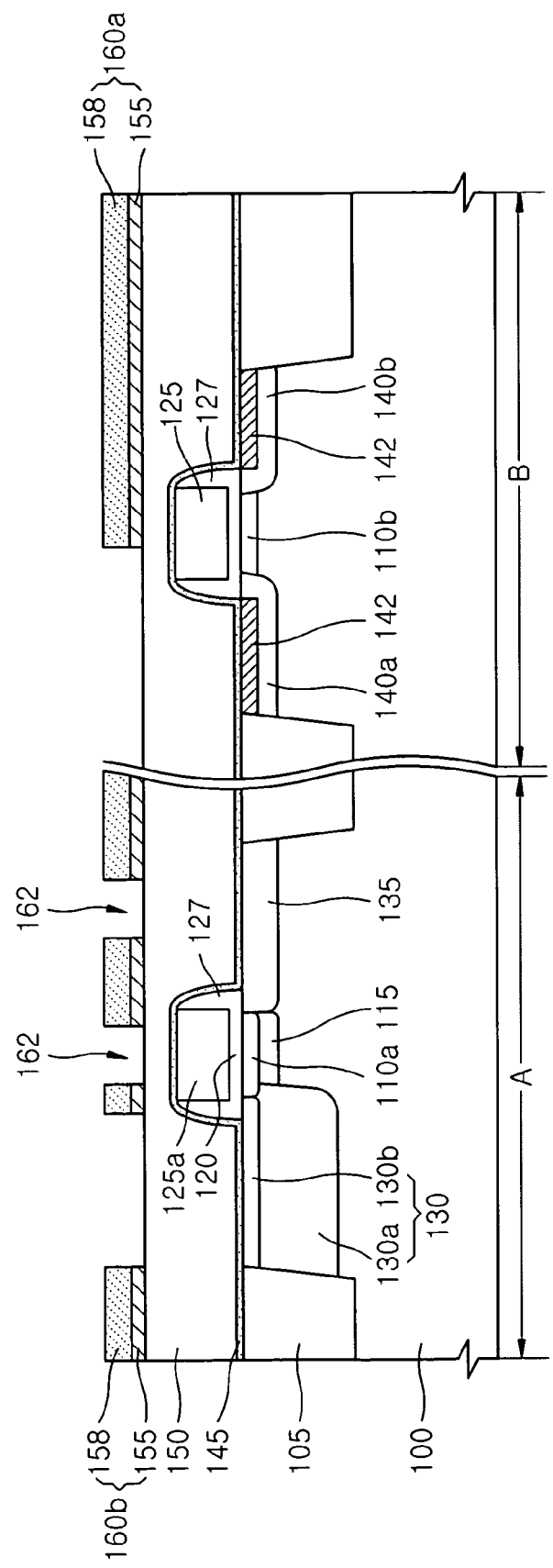
FIG. 3 is a sectional view of a CMOS image sensor according to another embodiment of the present invention.

Referring to FIG. 2C, predetermined portions of the capacitor insulating layer 158 and the first metal layer 155 are patterned to form a lower electrode 160a of the MIM capacitor on the peripheral circuit region B. At this time, simultaneously with forming the lower electrode 160a, the capacitor insulating layer 158 and the first metal layer 155 are patterned to remain on the periphery of the photodiode 130 of the pixel region A, thereby forming an optical shielding layer 160b. As illustrated, the optical shielding layer 160b may have an opening therein that exposes only the photodiode 130 portion on the pixel region A as shown in FIG. 2C, or multiple openings 162 that expose the photodiode 130 portion and portions where contacts will be formed as shown in FIG. 3. The openings 162 formed in the optical shielding layer 160b may be formed simultaneously with patterning the optical shielding layer 160b. The optical shielding layer 160b is simultaneously formed when the lower capacitor electrode 160a of the peripheral circuit region B is formed.

Figure 2D:
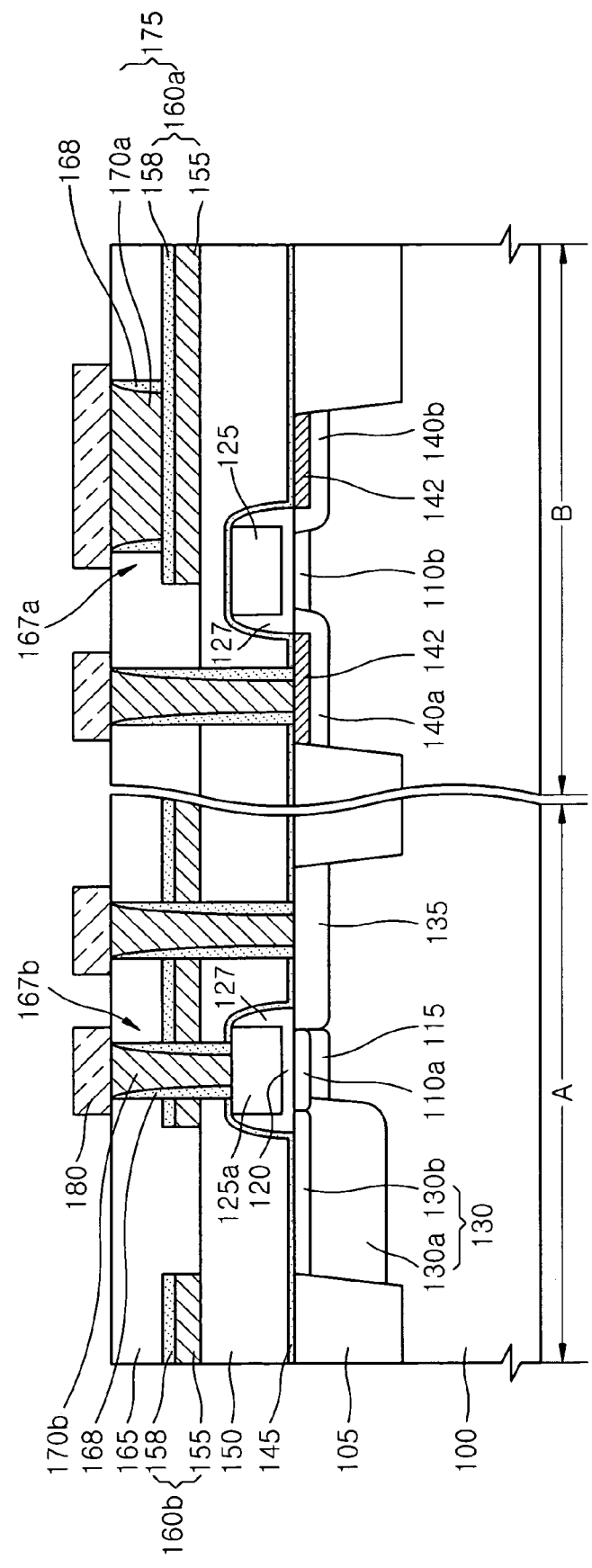

Referring to FIG. 2D, a second interlayer insulating layer 165 is deposited on an upper surface of the first interlayer insulating layer 150 on which the lower electrode 160a and the optical shielding layer 160b are formed. Then, the second interlayer insulating layer 165 and/or the first interlayer insulating layer 155, the optical shielding layer 160b on the pixel region A, and the etch stopper 145, as necessary, are etched to expose the capacitor insulating layer 158 of the lower electrode 160a, the gate electrodes 125a and 125, the floating diffusion region 130, and the selected junction regions 140a and 140b, thereby forming an upper electrode opening 167a and a contact hole 167b. Thereafter, in order to prevent short of the metal layer 155 (forming the optical shielding layer 160a) from a conductive layer to be filled into the contact hole 167b, a contact spacer 168 is formed along the sidewalls of the upper electrode opening 167a and the contact hole 167b. The contact spacer 168 may be formed of, e.g., silicon nitride. Here, when the contact spacer 168 is formed within the contact hole 167b, the short between the metal layer 155 forming the optical shielding layer 160b and the conductive layer to be filled into the contact hole 167b can be prevented even if misalignment occurs when the opening 162 is already formed in the optical shielding layer 160b for the contact as shown in FIG. 3.

The upper electrode opening 167a formed with the contact spacer 168, and the contact hole 176b are then filled with a conductive layer (e.g., a metal layer), thereby forming an upper electrode 170a in the upper electrode opening 167a, and a contact plug 170b within the contact hole 167b. By doing so, the MIM capacitor 175 is completed on the peripheral circuit region B. Then, first metal interconnects 180 are formed on an upper surface of the second interlayer insulating layer 165 to contact the upper electrode 170a and respective contact plugs 170b.

Referring to FIG. 2E, a third interlayer insulating layer 185 is formed on an upper surface of the second interlayer insulating layer 165 where the first metal interconnect 180 is formed. Then, a first via plug 187 is formed within the third interlayer insulating layer 185 to make the first metal interconnect 180 contact the lower electrode 160a of the MIM capacitor 175. Thereafter, a second metal interconnect 190 is formed on the third interlayer insulating layer 185 to contact the first via plug 187. Subsequently, a fourth interlayer insulating layer 195 is formed on the third interlayer insulating layer 185 where the second metal interconnect 190 is formed, and a second via plug 197 contacting the second metal interconnect 190 is formed within the fourth interlayer insulating layer 195 by the same method as above. A third metal interconnect 200 is formed on the fourth interlayer insulating layer 195 to contact the second via plug 197, and a passivation layer 210 is formed on the uppermost portion. Although not illustrated in the drawings, formation of a micro-lens and formation of a color filter then occur according to a well-known method.

Figure 4:
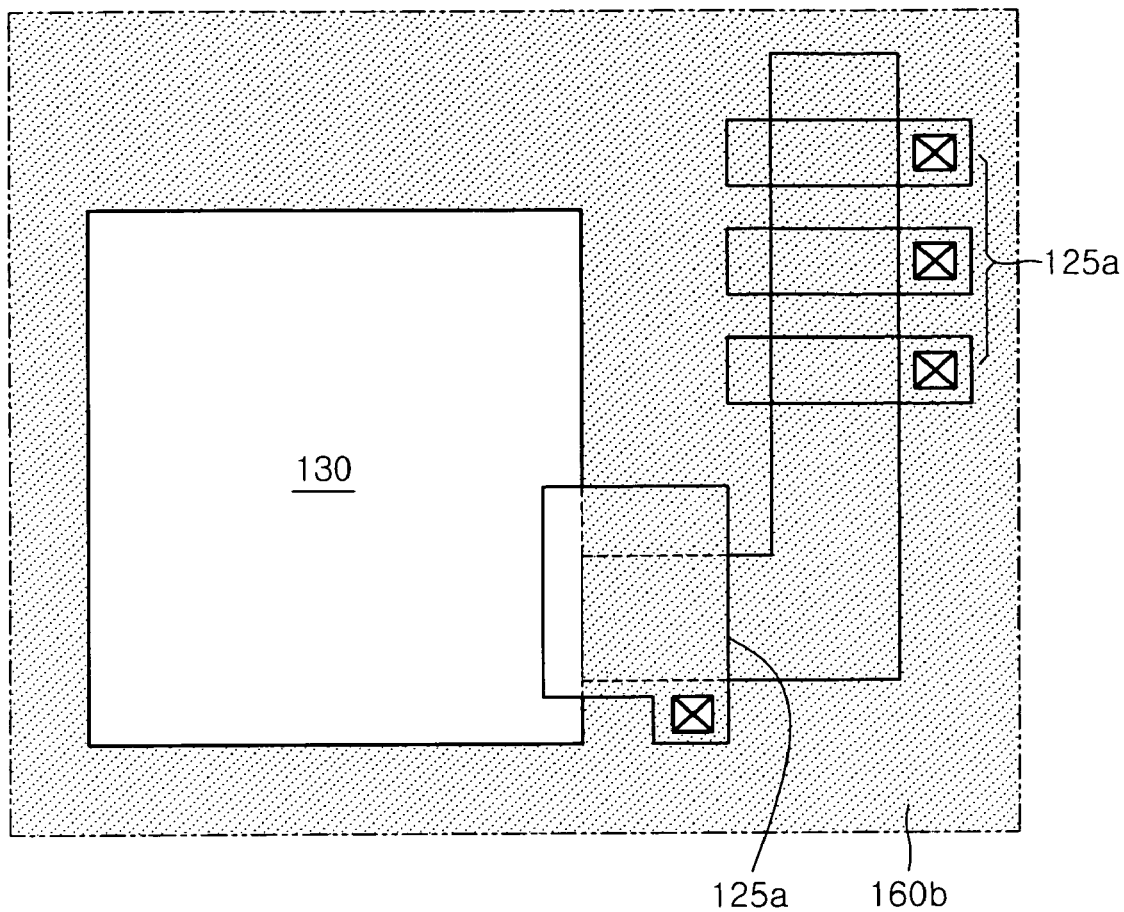
FIG. 4 is a plan view of a unit pixel of the CMOS image sensor covered with an optical shielding layer according to one embodiment of the present invention.

According to the present invention as described above, the optical shielding layer 160b that shields all regions exclusive of the photodiode 130 is formed on the pixel region A simultaneously with forming the lower capacitor electrode 160a of the peripheral circuit region B. That is, the optical shielding layer 160b formed on the pixel region A is formed on the overall pixel region except for the regions where the photodiode 130 is formed and the contacts are formed as shown in FIG. 4 to be closer to the outer periphery of the photodiode 130 than the metal interconnects 180, 190, and 200. Therefore, light applied to adjacent pixels (photodiode) can be thoroughly blocked from each individual pixel.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An integrated circuit device, comprising:
  a complementary metal oxide semiconductor (CMOS) image sensor, said CMOS image sensor comprising:
    a transfer gate electrode on a semiconductor substrate;
      a P-N junction photodiode within the semiconductor substrate, adjacent a first side of said transfer gate electrode;
      a floating diffusion region within the semiconductor substrate, adjacent a second side of said transfer gate electrode;
      an interlayer insulating layer extending on the semiconductor substrate and opposite said transfer gate electrode, said P-N junction photodiode and said floating diffusion region;
      an optical shielding layer of a first material on said interlayer insulating layer, said optical shielding layer having an opening therein extending opposite said P-N junction photodiode; and
      a hard mask layer comprising a second material, on said optical shielding layer; and
    a metal-insulating-metal (MIM) capacitor on said interlayer insulating layer, said MIM capacitor comprising an electrode formed of the first material and a capacitor dielectric layer of the second material.

2. The integrated circuit device of claim 1, wherein the electrode is a lower electrode of said MIM capacitor.

3. The integrated circuit device of claim 1, wherein said CMOS image sensor is configured so that said optical shielding layer has only a single optically transparent opening therein; and wherein the optically transparent opening extends opposite said P-N junction photodiode.

4. The integrated circuit device of claim 1, wherein the first material is selected from a group consisting of aluminum, tungsten and titanium nitride.

5. The integrated circuit device of claim 1, wherein the second material is silicon nitride.

6. The integrated circuit device of claim 1, further comprising a first electrically conductive contact plug extending through said optical shielding layer and contacting said floating diffusion region.

7. The integrated circuit device of claim 6, further comprising a second electrically conductive contact plug extending through said optical shielding layer and contacting said transfer gate electrode.

8. A CMOS image sensor comprising:
a semiconductor substrate having a pixel region and a peripheral circuit region;
transistors respectively formed on predetermined portions of the pixel region and the peripheral circuit region;
a photodiode formed in the semiconductor substrate at one side of the transistor on the pixel region;
an interlayer insulating layer formed on the semiconductor substrate where the transistors and the photodiode are formed;
a lower electrode of an MIM (Metal-Insulator-Metal) capacitor formed on an upper surface of the interlayer insulating layer corresponding to the peripheral circuit region;
an optical shielding layer formed on an upper surface of the interlayer insulating layer corresponding to the pixel region, and formed to expose the photodiode; and
a hard mask layer on an upper surface of said optical shielding layer.

9. The CMOS image sensor of claim 8, wherein the lower electrode of the MIM capacitor and the optical shielding layer are composed of the same material.

10. The CMOS image sensor of claim 9, wherein the lower electrode of the MIM capacitor and the optical shielding layer are composed of any one selected from a group consisting of aluminum, tungsten, and titanium nitride.

11. The CMOS image sensor of claim 8, further comprising a capacitor insulating layer on said lower electrode of the MIM capacitor.

12. The CMOS image sensor of claim 11, wherein the capacitor insulating layer and the hard mask layer are composed of the same material.

13. The CMOS image sensor of claim 12, wherein the capacitor insulating layer and the hard mask layer are composed of silicon nitride.

14. The CMOS image sensor of claim 8, further comprising a second interlayer insulating layer on an upper surface of the interlayer insulating layer where the lower electrode of the MIM capacitor and the optical shielding layer are formed, wherein the second interlayer insulating layer comprises an upper electrode on a location corresponding to the lower electrode of the MIM capacitor.

15. The CMOS image sensor of claim 14, further comprising:
a first metal interconnect structure electrically contacting the gate electrodes and the selected junction regions of the transistors of the pixel region and the peripheral circuit region; and
a second metal interconnect structure electrically contacting the upper electrode of the peripheral circuit region.

16. A CMOS image sensor comprising:
a semiconductor substrate having a pixel region and a peripheral circuit region;
transistors respectively formed on predetermined portions of the pixel region and the peripheral circuit region;
a photodiode formed in the semiconductor substrate at one side of the transistor on the pixel region;
an interlayer insulating layer formed on the semiconductor substrate where the transistors and the photodiode are formed;
a lower electrode of an MIM (Metal-Insulator-Metal) capacitor formed on an upper surface of the interlayer insulating layer corresponding to the peripheral circuit region; and
an optical shielding layer formed on an upper surface of the interlayer insulating layer corresponding to the pixel region, and formed to expose the photodiode;
wherein the optical shielding layer comprises a groove portion corresponding to a selected portion of the gates and a junction region of the transistors.

17. A CMOS image sensor comprising:
a semiconductor substrate having a pixel region and a peripheral circuit region;
transistors respectively formed on predetermined portions of the pixel region and the peripheral circuit region;
a photodiode formed in the semiconductor substrate at one side of the transistor on the pixel region;
an interlayer insulating layer formed on the semiconductor substrate where the transistors and the photodiode are formed;
a lower electrode of an MIM (Metal-Insulator-Metal) capacitor formed on an upper surface of the interlayer insulating layer corresponding to the peripheral circuit region;
an optical shielding layer formed on an upper surface of the interlayer insulating layer corresponding to the pixel region, and formed to expose the photodiode;
a second interlayer insulating layer on an upper surface of the interlayer insulating layer where the lower electrode of the MIM capacitor and the optical shielding layer are formed, wherein the second interlayer insulating layer comprises an upper electrode on a location corresponding to the lower electrode of the MIM capacitor;
a first metal interconnect structure electrically contacting the gate electrodes and the selected junction regions of the transistors of the pixel region and the peripheral circuit region; and
a second metal interconnect structure electrically contacting the upper electrode of the peripheral circuit region;
wherein the first metal interconnect structure comprises:
a contact plug formed by penetrating through the interlayer insulating layer;
a contact spacer formed to surround an outer periphery of the contact plug; and
a metal interconnect formed on an upper surface of the contact plug.

18. The CMOS image sensor of claim 17, wherein the contact spacer is composed of silicon nitride.

19. A CMOS image sensor comprising:
a semiconductor substrate having a pixel region and a peripheral circuit region;
transistors respectively formed on proper places of the pixel region and the peripheral circuit region;
a photodiode formed in the semiconductor substrate at one side of the transistor on the pixel region;
a first interlayer insulating layer formed on the semiconductor substrate where the transistors and the photodiode are formed;

a lower electrode formed on an upper surface of the first interlayer insulating layer of the peripheral circuit region, and including a capacitor insulting layer on a surface thereof;

an optical shielding layer formed on an entire surface of the first interlayer insulating layer of the pixel region, and exposing the photodiode;

a second interlayer insulating layer formed on the first interlayer insulating layer including the lower electrode and the optical shielding layer;

an upper electrode formed in the second interlayer insulating layer disposed on the capacitor insulating layer; and a metal interconnect structure formed on the second interlayer insulating layer and electrically connected to the gate electrode;

wherein the optical shielding layer comprises a metal layer and a hard mask layer formed on an upper surface of the metal layer.

20. The CMOS image sensor of claim 19, wherein the lower electrode and the metal layer of the optical shielding layer are composed of the same metal layer, and the capacitor insulating layer and the hard mask layer are composed of an identical insulating layer.

21. An integrated circuit device, comprising:

a complementary metal oxide semiconductor (CMOS) image sensor in a semiconductor substrate;

an interlayer insulating layer on the CMOS image sensor;

an optical shielding layer of a first material on said interlayer insulating layer, said optical shielding layer having an opening therein extending opposite a portion of said CMOS image sensor;

a hard mask layer comprising a second material, on said optical shielding layer; and a metal-insulating-metal (MIM) capacitor on said interlayer insulating layer, said MIM capacitor comprising an electrode formed of the first material and a capacitor dielectric layer comprising the second material.

* * * * *